United States Patent [19]

Blinchikoff et al.

[11] 4,352,074
[45] Sep. 28, 1982

[54] PHASE-LOCKED LOOP FILTER

[75] Inventors: Herman J. Blinchikoff, Baltimore; George R. Vaughan, Linthicum Heights, both of Md.

[73] Assignee: Westinghouse Electric Corp., Pittsburgh, Pa.

[21] Appl. No.: 117,704

[22] Filed: Feb. 1, 1980

[51] Int. Cl.³ .............................................. H03L 7/08
[52] U.S. Cl. ...................................... 331/17; 330/107; 331/25; 333/167
[58] Field of Search ........................... 331/1 R, 17, 25; 307/520, 521, 522; 328/167, 155; 330/107, 109, 126; 333/167

[56] References Cited

U.S. PATENT DOCUMENTS

| | | |
|---|---|---|
| 2,770,730 | 11/1956 | Urtel . |
| 3,316,497 | 4/1967 | Brooks ................................. 331/17 |
| 3,421,105 | 1/1969 | Taylor . |
| 3,496,479 | 2/1970 | MacPherson ........................ 328/167 |
| 3,605,033 | 9/1971 | Nakamura ........................ 331/17 X |
| 3,629,721 | 12/1971 | Fordyce et al. .................... 330/107 |
| 3,657,669 | 4/1972 | Proakis ............................ 328/167 X |
| 3,740,671 | 4/1972 | Crow et al. ....................... 331/17 X |
| 3,805,178 | 4/1974 | Rollett ................................ 330/107 |
| 3,831,103 | 8/1974 | Ruegg et al. ......................... 330/107 |
| 3,835,399 | 9/1974 | Holmes ............................ 328/167 X |
| 3,906,390 | 10/1974 | Rollett ................................ 330/107 |
| 3,919,658 | 11/1975 | Friend ................................. 330/107 |
| 3,946,328 | 3/1976 | Boctor ................................ 330/107 |
| 3,980,969 | 9/1976 | Stengel ................................. 331/17 |
| 4,015,224 | 3/1977 | Benzinger ........................ 330/107 X |
| 4,031,483 | 6/1977 | Formeister ........................... 331/17 |
| 4,050,023 | 9/1977 | Edgar ............................. 330/107 X |

OTHER PUBLICATIONS

Gardner, "Phaselock Techniques," John Wiley & Son, Inc., 1966, pp. 7-16 and 71-77.
Habrat, "Filters For Audio-Frequency Band With Operational Amplifiers," Elektronika, vol. 17, No. 3, pp. 118-121, 1976-Poland.
Berthold et al., "Active High Pass and Low Pass Filters Using Commercially Available Resistors and Capacitors," Elektronik, vol. 25, No. 9, pp. 73-74; Sep., 1976-Germany.
Lew, Jr., "A Primer on Phase-Locked Loops," Electronic Design, Jul. 20, 1964; pp. 56-60.
Gorski-Popiel, "Frequency Synthesis: Techniques and Applications," IEEE Press New York, NY 1975, pp. 69-72 and 95-119.
Holt et al., "Transient Response of Elliptic Function Filters," IEEE Trans. on Circuit Theory, vol. CT-15, pp. 71-73, Mar. 1968.
Chang, "Maximally Flat Amplitude Low-Pass Filter with Arbitrary No. Of Pairs of Real Freq. Transmission Zeros," IEEE Trans. on Circuit Theory; vol. CT-15; pp. 465-467; Dec. 1968.
Gupta, "Phase Locked Loops," Proceedings of the IEEE, vol. 63, No. 2, Feb. 1975, pp. 291-306.
Gill et al., "Use ICs in Your Phase-Locked Loop," Electronic Design 8, Apr. 11, 1968; pp. 76-79.

*Primary Examiner*—Siegfried H. Grimm
*Assistant Examiner*—Edward P. Westin
*Attorney, Agent, or Firm*—R. M. Trepp

[57] ABSTRACT

A tunable narrow-band filter is described incorporating a phase-locked loop that includes a phase detector, amplifier, loop filter, and voltage controlled oscillator wherein the loop filter transfer function is derived or extracted from the desired closed-loop transfer function that is of order n=3 or greater. The loop filter may furthermore have finite transmission zeros or peak attenuation at specific frequencies close to the passband which also appear in the characteristics of the narrow-band filter.

The invention overcomes the problem of providing peak attenuation close to the passband of an electronically tunable narrow-band filter.

10 Claims, 6 Drawing Figures

4,352,074

PHASE-LOCKED LOOP FILTER

GOVERNMENT CONTRACT

The Government has rights in this invention pursuant to Contract No. F19628-76-C-0117 awarded by the Department of the Air Force.

BACKGROUND OF THE INVENTION

1. Field of the Invention

This invention relates to tunable filters and more particularly to phase-locked loop filters having a closed-loop transfer function of the third order or above.

2. Description of the Prior Art

There exists a need in communication and radar frequency generation subsystems for "clean-up" tracking filters. Typically the frequency to be filtered, $f_0$, is contaminated with interfering frequencies that have a fixed frequency spacing relative to $f_0$. Furthermore, the entire spectrum can shift although the relationship between the desired output frequency and the interfering frequency is fixed. The solution calls for a narrow-band filter that can be tuned over the range of frequency variation.

Of the passive filter possibilities, crystal filters have the required narrow bandwidth and low insertion loss, but making them electronically tunable is not practical now. Phase-locked loops offer the practical solution to this filtering problem and are extensively used for this purpose. A general discussion of phase-locked loops is found in a publication entitled "Phase-Locked Loops" by S. C. Gupta, Proceedings of the IEEE, Vol. 63, No. 2, February 1975 pp. 291-306. As described in Gupta a phase-locked loop comprises a phase detector, amplifier, loop filter, and voltage controlled oscillator coupled in series with the output fed back to the input. The characteristics of the phase-locked loop are determined by the closed-loop transfer function that relates the phase of the input signal to the phase of the output signal. If the phase detector and voltage controlled oscillator are assumed linear, then a closed-loop transfer function may be expressed by equation (1), where s is the Laplace operator, K is a constant, and F(s) is the transfer function of the loop filter.

$$H_c(s) = \Phi_o(s)/\Phi_i(s) = KF(s)/(s + KF(s)) \tag{1}$$

The power of s in the denominator of the closed-loop transfer function $H_c(s)$ determines the order of the phase-locked loop (e.g., first, second, third, etc.).

Normally, when a narrow-bandwidth tracking filter is needed, a second-order loop is selected, because this system remains stable, independent of the open-loop gain value and acquires lock reliably within the loop capture range. Unfortunately the second-order phase-locked loop does not provide enough attenuation close to the passband to adequately suppress unwanted frequencies. Prior higher-order loops such as a third-order loop may substantially outperform the second order loop but it is more complicated and harder to analyze and can become unstable as indicated on page 73 in a book entitled "Phaselock Techniques" by F. M. Gardner published in 1966 by John Wiley & Sons, Inc.

Higher-order all-pole phase-locked loops such as a sixth-order phase-locked loop are discussed in a book entitled "Frequency Synthesis: Techniques and Applications" by J. Gorski-Popiel, IEEE Press, New York, N.Y. in chapter 4 at pp. 111-116, but he does not address the narrow-band, tunable filter problem.

The objections to higher-order loops arise because the loop is usually used in the receiver where the signal-to-noise ratio is small. In this case the open-loop gain may change drastically because of the variation attributed to the noise, yielding the undesirable possibility of an unstable system. However, there are applications where the phase-locked loop is used in both Frequency Synthesizers and the System Modulator. Here the signal-to-noise ratio is high and the open-loop gain remains essentially constant. It is to these applications that this invention is particularly directed.

It is desirable to provide a phase-locked loop filter having a third or higher order transfer function to provide more attenuation close to the passband without upsetting the phase margin or the acquisition characteristic. It is essential to realize that the order of the loop is defined herein by the highest power of the Laplace operator s in the denominator of the closed-loop transfer function. The higher-order loops considered in this invention exhibit an open-loop magnitude response variation of $-20$ dB/decade over the frequency range where the open-loop magnitude response is greater than unity. Therefore, the higher order loops considered herein exhibit the acquisition characteristic of a first order loop. Thus the acquisition of these loops presents no problem.

It is desirable to provide a simple synthesis procedure for the loop filter of a phase-locked loop filter apparatus to realize a closed-loop transfer function with finite transmission zeros for specific values of $\omega$. The finite transmission zero may be represented in the s-plane by zeros located in the $j\omega$ axis.

It is desirable to provide a phase-locked loop having a transfer function that corresponds to or duplicates a known optimized filter response such as an elliptic filter response.

It is further desirable to have a tunable filter with highly selective frequency characteristics such as the Cauer (elliptic); i.e. Chebyshev passband and stop-band attenuation, or the maximally-flat delay filter response with Chebyshev stop-band attenuation implemented by inserting a loop filter having circuit components of selected values and interconnected to form a unique loop filter transfer function in a phase-locked loop to provide the known filter response.

SUMMARY OF THE INVENTION

In accordance with the present invention, a narrow-band filter apparatus is provided for tracking a selected frequency in an input signal and for providing peak attenuation at fixed frequency spacings from the selected frequency comprising a phase-locked loop including a linear phase detector, an amplifier, a loop filter, and voltage controlled oscillator coupled in series, with the output fed back to the input, and having a means for coupling an input signal to the linear phase detector and means for outputting a signal from the voltage controlled oscillator, said phase-locked loop having a predetermined open-loop gain K; said loop filter having circuit components of selected values and interconnected to provide a predetermined transfer function $H_L(s)$ characterized by the numerator having a first polynomial in s of at most degree $n-1$ and being equal to 0 for specific values of $j\omega$ when s is set equal to $j\omega$, where j is the square root of $-1$ and $\omega$ is the radian frequency, and not equal to 0 when $\omega$ equals 0 and a denominator having a second polynomial in s of degree $n-1$ where n is an integer greater than 2.

The invention further provides filter apparatus for providing a filter of known frequency response in phase-locked form.

DESCRIPTION OF THE PREFERRED EMBODIMENT

Figure 1:
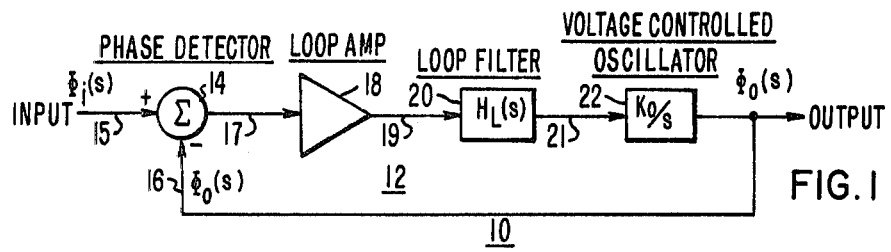
FIG. 1 is a block diagram of one embodiment of the invention.

Referring to FIG. 1, filter apparatus 10 includes a linear phase detector 14 having a first input on line 15 and a second input on line 16. The linear phase detector functions to compare the phase of the signals on lines 15 and 16 to provide an output signal having a voltage proportional to the phase difference. The output of phase detector 14 is coupled over line 17 to an input of amplifier 18. Amplifier 18 functions to amplify the signal on line 17. The output of amplifier 18 is coupled over line 19 to an input of loop filter 20. Loop filter 20 has circuit components of selected values and the components are arranged and interconnected to provide a predetermined transfer function $H_L(s)$ characterized by the numerator having a first polynomial in s of at most degree $n-1$, and being equal to 0 for specific values of $j\omega$ when s is set equal to $j\omega$ where j is the square root of $-1$ and $\omega$ is the radian frequency, and not being equal to 0 when $\omega$ equals 0, and a denominator having a second polynomial in s of degree $n-1$ where n is an integer greater than 2. The loop filter 20 functions to provide the phase-locked loop 12 with a characteristic closed-loop transfer function. The output of loop filter 20 is coupled over line 21 to the input of voltage controlled oscillator 22.

Voltage-controlled oscillator 22 functions to provide an output frequency that is proportional to the input voltage over a predetermined frequency range. One example of a voltage controlled oscillator suitable for oscillator 22 is described in U.S. Pat. No. 3,571,754 issued Mar. 23, 1971 to D. J. Healey, III and M. M. Driscoll entitled "Wide Deviation Voltage Controlled Crystal Oscillator" which is assigned to the assignee herein. The output of voltage controlled oscillator 22 is coupled over line 16 to a second input of phase detector 14 and to an output terminal for outputting a signal.

Voltage-controlled oscillator 22 has a transfer function of $K_0/s$ where $K_0$ is the gain of the voltage controlled oscillator and s is the Laplace operator. Loop amplifier 18 has a transfer function of $K_a$ where $K_a$ is the gain of loop amplifier 18. Phase detector 14 has a transfer function of $K_d[\Phi_i(s) - \Phi_o(s)]$ where $K_d$ is the gain of the phase detector and $\Phi_i(s)$ and $\Phi_o(s)$ relate to the input and output phase of filter apparatus 10. The linear model of the phase-locked loop for the embodiment of FIG. 1, filter apparatus 10, is described in equation (2) as a phase-locked loop 12 having constant open-loop gain and a linear phase detector 14 and linear voltage controlled oscillator 22.

$$H_c(s) = \Phi_o(s)/\Phi_i(s) = KH_L(s)/(s + KH_L(s)) \quad (2)$$

These characteristics approximate the real devices used in phase-locked loop 12 over a predetermined frequency band and a predetermined input signal dynamic range. In equation (2) the closed-loop transfer function $H_c(s)$ relates the output phase $\Phi_0(s)$ to the input phase $\Phi_i(s)$ where K in equation (2) is equal to $K_d$ multiplied by $K_a$ multiplied by $K_0$ and is the predetermined open-loop gain of phase-locked loop 12 and has dimensions of reciprocal time. Equation (2) reveals that $H_c(s)$ is unity at s equal 0 provided that $H_L(s)$ is non-zero at s equal 0. A low-pass transfer function satisfies this condition.

When utilizing a loop filter having circuit components of selected values and interconnected to provide a predetermined transfer function $H_L(s)$, then the characteristics of the closed-loop transfer function $H_c(s)$ of phase-locked loop 12 may be determined utilizing equation (2). A loop filter may be utilized that causes the closed-loop transfer function of phase-locked loop 12 to have finite transmission zeros on the $j\omega$ axis, which is the ordinant in the s-plane having $\sigma$ as the abscissa. Consequently, a transmission zero on the $j\omega$ axis may be positioned $\Delta f$ from the center frequency $f_0$ with the result that the unwanted frequency spaced at $f_0 \pm \Delta f$ is reduced to an insignificant level. A closed-loop transfer function $H_c(s)$ with transmission zeros on the $j\omega$ axis offers the advantage of additional attenuation to interfering signals closely spaced to the desired output frequency $f_0$ without degradation of the loop phase-margin or acquisition characteristic. By utilizing a loop filter that is derived from a desired closed-loop transfer function $H_d(s)$, a phase-locked loop 12 may be fabricated to exhibit known filter responses that in phase-locked form are tunable over a given frequency range. The filter is electronically tunable in the context that the input signal to the filter and the filter transfer function tune the filter by action of the phase-locked loop.

The unusual combination of phase-locked loop technology and modern filter design allows the engineer to insert a loop filter that will result in a phase-locked loop that exhibits the response of a filter whose characteristics are listed in standard texts, thus eliminating the tedious calculations associated with the approximation problem. The approximation problem involves finding the poles and zeros of the closed loop transfer function that satisfies the system requirements provided. The most notable and useful of the known filter responses are the Cauer (elliptic) filter responses, those with Chebyshev pass band and stop band attenuation, and the maximally-flat delay filter with Chebyshev stop band attenuation.

In addition, a loop filter may be selected that has a transfer function derived from a desired transfer function of the phase-locked loop such that the phase-locked loop 12 will exhibit an all-pole response of order n (such as Butterworth, Chebyshev, Bessel, etc.).

The unique transfer function in phase-locked form applies to the important class of phase-locked loops that include the following characteristics:

1. The frequency tuning range is confined to the frequency range for which the open-loop magnitude response is greater than unity. However, the tuning range can be increased by pre-positioning with additional circuitry, for example, by forcing the loop VCO to a desired frequency.

2. The absolute value of the loop bandwidth is sufficiently narrow so that the loop transport lag may be neglected.

3. The input signal-to-noise ratio is large so that open loop gain variations attributable to noise are negligible.

Synthesis of $H_c(s)$ to duplicate a desired filter transfer function in phase-locked loop form requires that K of equation (2) and the loop filter 20 transfer function $H_L(s)$ be determined.

First, let the transfer function of loop filter 20, $H_L(s)$, be represented by equation (3) where $p(s)$ and $q(s)$ are each polynomials with all common factors removed.

$$H_L(s) = p(s)/q(s) \tag{3}$$

The factor "s" is not allowed in $p(s)$ because the DC gain would then be zero. The loop would not lock under this condition. Substituting $H_L(s)$ from equation (3) into equation (2) yields equation (4).

$$H_c(s) = Kp(s)/(sq(s) + Kp(s)) \tag{4}$$

For the closed-loop transfer function $H_c(s)$ that contains finite transmission zeros on the $j\omega$ axis, a desired transfer function $H_d(s)$ is selected having a form that depends on the order n. The order n is determined from the highest power of the Laplace operator in the denominator of the function $H_d(s)$. The form of the desired transfer function $H_d(s)$ for n equals 3 and 4 is shown by equation (5).

$$H_d(s) = \frac{\frac{b_0}{\Omega_2^2}(s^2 + \Omega_2^2)}{s^n + b_{n-1}s^{n-1} + \ldots + b_0} \quad (n = 3 \text{ and } 4) \tag{5}$$

The form of the desired transfer function $H_d(s)$ for n equal 5 and 6 is shown by equation (6).

$$H_d(s) = \frac{\frac{b_0}{\Omega_2^2 \Omega_4^2}(s^2 + \Omega_2^2)(s^2 + \Omega_4^2)}{s^n + b_{n-1}s^{n-1} + \ldots + b_0} \quad (n = 5 \text{ and } 6) \tag{6}$$

For illustrative purposes, the transfer function in equation (5) is considered but higher-order systems may be synthesized in the same manner.

To have the phase-locked loop transfer function $H_c(s)$ in equation (4) duplicate or match the desired transfer function $H_d(s)$ in equation (5), $p(s)$ must be $K_1(s^2 + \Omega_2^2)$ where $K_1$ is a constant. Substituting for $p(s)$ in equation (4) results in equation (7).

$$H_c(s) = \frac{KK_1(s^2 + \Omega_2^2)}{sq(s) + KK_1(s^2 + \Omega_2^2)} \tag{7}$$

Since the denominator polynomial in equation (5) is of degree n, the polynomial $q(s)$ in equation (7) must be of degree $(n-1)$ as shown by equation (8).

$$q(s) = s^{n-1} + a_{n-2}s^{n-2} + \ldots + a_0 \tag{8}$$

Substituting the polynomial of equation (8) into equation (7) yields equation (9).

$$H_c(s) = \frac{KK_1(s^2 + \Omega_2^2)}{s^n + a_{n-2}s^{n-1} + \ldots + a_0 s + KK_1(s^2 + \Omega_2^2)} \tag{9}$$

The phase-locked loop transfer function $H_c(s)$ of equation (9) will duplicate or match the desired transfer function $H_d(s)$ in equation (5) if the coefficients of like powers of s are the same. The results of this matching are summarized in Table 1.

TABLE 1

| n | CONDITIONS FOR EQUATION (9) TO MATCH EQUATION (5) | $a_0$ | $a_1$ | $a_2$ | $KK_1$ |
|---|---|---|---|---|---|
| 3 | $a_1 + K_1K = b_2$<br>$a_0 = b_1$<br>$KK_1\Omega_2^2 = b_0$ | $b_1$ | $b_2 - \frac{b_0}{\Omega_2^2}$ | | $\frac{b_0}{\Omega_2^2}$ |
| 4 | $a_2 = b_3$<br>$a_1 + KK_1 = b_2$<br>$a_0 = b_1$<br>$KK_1\Omega_2^2 = b_0$ | $b_1$ | $b_2 - \frac{b_0}{\Omega_2^2}$ | $b_3$ | $\frac{b_0}{\Omega_2^2}$ |

The coeffcients $b_0$ through $b_{n-1}$ are not available in standard engineering texts but they may be determined from the poles of the desired closed loop transfer function, which are published.

The poles and zeros of the important Cauer filter class may be obtained by reference to the following two books "Handbook of Filter Synthesis" by A. I. Zverev, published by John Wiley & Sons, Inc. in 1967 and "Design of Filters Using the Catalog of Normalized Low-Pass Filters" by R. Saal, published by AEG-Telefunken, Backnang, Western Germany, 1978.

The relationship between these poles and the coefficients $b_0$ through $b_{n-1}$ where n=3,4 is in Table 2. Construction of Table 2 is straightforward to one skilled in the art of filter design.

TABLE 2

| n | POLES | $b_0$ | $b_1$ | $b_2$ | $b_3$ | NOTES |
|---|---|---|---|---|---|---|
| 3 | $-\sigma_0$<br>$-\sigma_1 \pm j\Omega_1$ | $\sigma_0\psi_1$ | $2\sigma_0\sigma_1 + \psi_1$ | $\sigma_0 + 2\sigma_1$ | | $\psi_1 = \sigma_1^2 + \Omega_1^2$ |
| 4 | $-\sigma_1 \pm j\Omega_1$<br>$-\sigma_3 \pm j\Omega_3$ | $\psi_1\psi_3$ | $2(\sigma_1\psi_3 + \sigma_3\psi_1)$ | $4\sigma_1\sigma_3 + \psi_1 + \psi_3$ | $2(\sigma_1 + \sigma_3)$ | $\psi_1 = \sigma_1^2 + \Omega_1^2$<br>$\psi_3 = \sigma_3^2 + \Omega_3^2$ |

The coefficient values in Table 1 allow the loop filter 20 transfer function $H_L(s)$ of equation (3) to be written as equation (10) where the phase-locked loop 12 transfer function has an order of n=3. Likewise equation (3) may be written as equation (11) where the phase-locked loop 12 transfer function has an order of n=4.

$$H_L(s) = \frac{K_1(s^2 + \Omega_2^2)}{s^2 + \left(b_2 - \frac{b_0}{\Omega_2^2}\right)s + b_1} \tag{10}$$

$$H_L(s) = \frac{K_1(s^2 + \Omega_2^2)}{s^3 + b_3 s^2 + \left(b_2 - 12\frac{b_0}{\Omega_2^2}\right)s + b_1} \quad (11)$$

From Table 1 the condition $KK_1 = b_0/\Omega_2^2$ implies that the gain of the phase-locked loop may be partitioned as required so long as their product is $b_0/\Omega_2^2$. $K_1$ may be set equal to $b_1/\Omega_2^2$. Then $H_L(s)$ is unity at $s=0$ and $K$ may be expressed by equation (12). From equation (12), $D_L(0)$ equals $b_1/b_0$ is the group delay at $\omega$ equal 0 of the low-pass filter with transfer function $H_d(s)$. Selecting $K_1$ in this way relates the open-loop gain $K$ to an important characteristic of the closed-loop response. Equation (13) shows the general expression for the loop filter 20 transfer function expressed in terms of the coefficients of the desired closed-loop transfer function $H_d(s)$ of order $n=3$. Equation (14) is the general expression for the loop filter 20 transfer function expressed in terms of the coefficients of the desired closed-loop transfer function of the phase-locked loop 12 of order $n=4$.

$$K = \frac{b_0}{b_1} = \frac{1}{D_L(0)} \quad (12)$$

$$H_L(s) = \frac{b_1}{\Omega_2^2} \cdot \frac{s^2 + \Omega_2^2}{s^2 + (b_2 - b_0/\Omega_2^2)s + b_1} \quad (13)$$

$$H_L(s) = \frac{b_1}{\Omega_2^2} \cdot \frac{s^2 + \Omega_2^2}{s^3 + b_3 s^2 + (b_2 - b_0/\Omega_2^2)s + b_1} \quad (14)$$

The order of $H_L(s)$ is always one less than the order of $H_c(s)$. Furthermore, $H_L(s)$ retains the same transmission zero as the closed-loop response $H_c(s)$, a characteristic that may be used to reduce unwanted harmonics from the phase detector 14.

The loop filter 20 transfer function $H_L(s)$ will now be described for a phase-locked loop 12 having a desired transfer function $H_d(s)$ that does not contain finite transmission zeros and is known as an all-pole transfer function because all zeros occur at infinity in the s-plane. The all-pole transfer function includes the well-known Butterworth, Chebyshev, Guassian, Bessel, Synchronous, Legendre, and transitional responses described in the book "Handbook of Filter Synthesis" by A. I. Zverev, published by John Wiley & Sons, Inc. in 1967.

The desired all-pole transfer function for a phase-locked loop 12 may be given by equation (15).

$$H_d(s) = b_0/(s^n + b_{n-1}s^{n-1} + \ldots + b_0) \quad (15)$$

The transfer function of the phase-locked loop 12, $H_c(s)$, as expressed in equation (4) should have a loop filter 20 whose transfer function is selected so that $H_c(s)$ duplicates $H_d(s)$ in equation (15). Then for $p(s)$ being a constant $K_2$ and for $q(s)$ given by equation (8), then $H_c(s)$ from equation (4) becomes equation (16).

$$H_c(s) = KK_2/(s^n + a_{n-2}s^{n-1} + \ldots + a_0 s + KK_2) \quad (16)$$

Equating $H_c(s)$ of equation (16) to $H_d(s)$ of equation (15) requires the coefficients of like powers of $s$ to be equal, yielding the results in Table 3.

TABLE 3

| $a_{n-2}$ | = | $b_{n-1}$ |
|---|---|---|

TABLE 3-continued

| $a_0$ | = | $b_1$ |
|---|---|---|
| $KK_2$ | = | $b_0$ |

The loop filter 20 transfer function $H_L(s)$ from equation (3) becomes equation (17).

$$H_L(s) = K_2/(s^{n-1} + b_{n-1}s^{n-2} + \ldots + b_1) \quad (17)$$

For unity gain at $\omega=0$, $K_2$ is set equal to $b_1$. Then, from Table 3, $K$ may be represented by equation (18).

$$K = b_0/K_2 = b_0/b_1 = 1/D_L(0) \quad (18)$$

The gain $K$ has been related in equation (18) to the group delay at $\omega=0$ of the low-pass filter with transfer function $H_d(s)$. The general expression for the loop filter 20 transfer function $H_L(s)$ is described by equation (19).

$$H_L(s) = b_1/(s^{n-1} + b_{n-1}s^{n-2} + \ldots b_1) \quad (19)$$

$H_L(s)$ is also an all-pole low-pass transfer function whose order is always one less than the order of $H_c(s)$.

Now that a loop filter 20 may be selected to provide a phase-locked loop having a transfer function $H_c(s)$ that duplicated a desired and well-known low-pass filter transfer function with or without finite transmission zeros on the $j\omega$ axis, all responses that characterize the well-known filter now characterize the phase-locked loop 12. Furthermore, many of the popular filter responses are given in the books by A. I. Zverev and R. Saal previously cited and only denormalization, a well-known procedure, remains to obtain the loop responses. For example, suppose the phase-locked loop 12 is excited by a step of phase $\Delta\theta$, whose Laplace transform is $\Delta\theta/s$. From equation (1) or (2) the output transform is shown by equation 20.

$$\Phi_o(s) = H_c(s)\Phi_i(s) = \Delta\theta(H_c(s)/s) \quad (20)$$

The output phase function is shown by equation (21).

$$\theta_o(t) = \Delta\theta g_c(t) \quad (21)$$

where $g_c(t)$ is the step response associated with $H_c(s)$. Then the abscissa of the tabulated normalized step response $g_c(t)$ is denormalized to yield the closed-loop response to a step change in the input phase.

Figure 3:
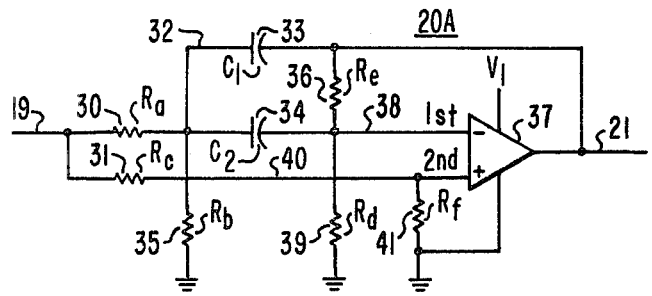
FIG. 3 is an active circuit schematic of a loop filter for use in the $n=3$ embodiment of FIG. 1.
Figure 4:
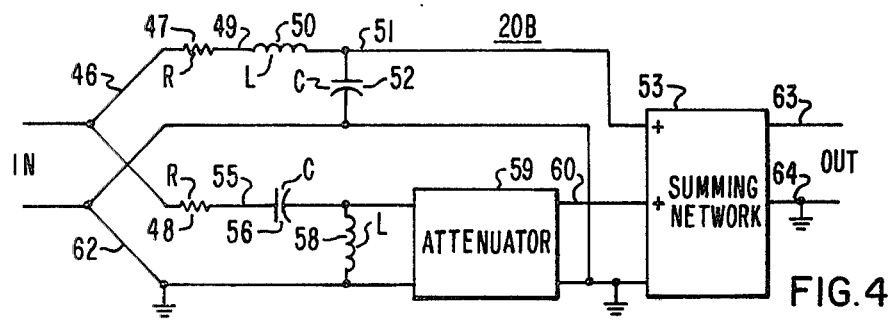
FIG. 4 is a passive realization of a loop filter for use in the $n=3$ embodiment of FIG. 1.

Loop filter 20 can be realized actively or passively such as by incorporating integrated circuits or by only resistors, capacitors and inductors as shown by the $n=3$ realizations in FIGS. 3 and 4. An example is now provided for realizing a phase-locked loop 12 with a predetermined filter response by inserting a loop filter having a predetermined transfer function. The open-loop and closed-loop magnitude responses of the resulting phase-locked loop will also be shown.

For example, filter apparatus 10 is desired to track a signal in the vicinity of 1 megahertz. The attenuation in a specified 2 kilohertz bandwidth must be 0.1 decibels or less. The 2 kilohertz bandwidth reflects as a closed-loop lowpass bandwidth of $f_{cut\,off}=1$ kilohertz. System requirements external to filter apparatus 10 suggest the prototype to be filter apparatus of order $n=3$ with the characteristics of the well-known Cauer filter with $\rho$ equal 15 percent and $\theta$ equal 10 degrees. A Cauer filter design tabulated in the aforementioned book by A. I. Zverev entitled "Handbook of Filter Synthesis" at page 176 characterizes the third-order Cauer filter with a maximum passband reflection coefficient of 15 percent (0.1 dB). The filter design is normalized so that the radian ripple bandwidth is unity. From page 176 of the book by A. I. Zverev, a Cauer filter of n=3, $\rho$=15 percent and $\theta$=10 degrees has the following design data:

$\sigma_0 = 0.98674$ $\sigma_1 = 0.47445$ $\Omega_1 = 1.20999$ $\Omega_2 = 6.6370$ Substituting these values in Table 2 for n=3 results in the following values for the coefficients:

$b_0 = 1.66678$ $b_1 = 2.6255$ $b_2 = 1.93564$ and the normalized gain K from equation (12) is equal to 0.63484.

The transfer function for loop filter 20 descrbied by equation (13) may be expressed as equation (22).

$$H_L(s) = 0.0596(s^2 + 44.04977)/(s^2 + 1.8978s + 2.6255) \quad (22)$$

Figure 2:
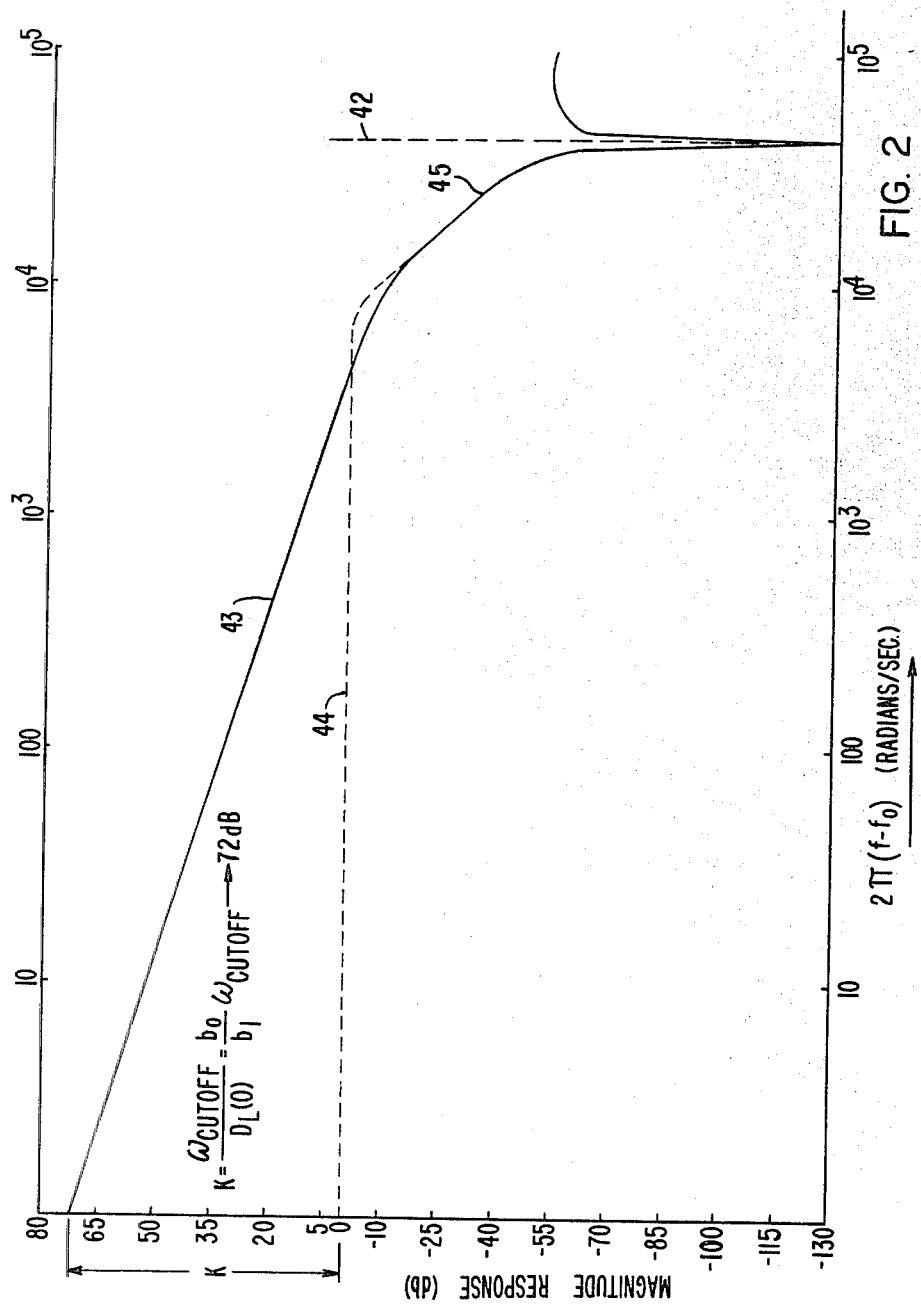
FIG. 2 is a graph of the open-loop and closed-loop magnitude response for a third-order loop of the embodiment of FIG. 1.

The closed-loop response of phase-locked loop 12 now has the desired transfer function given by equation (5) with n=3. The open-loop and closed-loop magnitude responses are shown in FIG. 2. In FIG. 2 the ordinate represents magnitude response in decibels and the abscissa represents $2\pi(f-f_0)$ in radians per second. The open-loop magnitude response is shown by curve 43 and the closed-loop magnitude response is shown by curve 44. Curves 43 and 44 merge to form one curve 45 for frequencies above $1.5 \times 10^4$ radians/second.

The open-loop magnitude response variation is $-20$ dB/decade over the passband of the closed-loop response, exceeding the frequency range where the open-loop magnitude response is greater than unity. This third-order loop exhibits the acquisition characteristics of a first-order loop; thus the acquisition of this loop presents no problem.

The open-loop gain constant for this phase-locked loop is the value of the open-loop magnitude response at $\omega = 1$ radian/sec. (see FIG. 2). For this case the denormalized value of K is $0.63484 \times \omega_c = 0.63484 \times 2\pi \times 1000 = 3989$ corresponding to 72 dB.

An active and passive realization of loop filter 20 having the transfer function $H_L(s)$ is shown by the circuit schematics in FIGS. 3 and 4, respectively.

Loop filter 20a in FIG. 3 has line 19 coupled to one end of resistors 30 and 31. The other side of resistor 30 is coupled over line 32 to one side of capacitors 33 and 34 and one side of resistor 35. The other side of capacitor 33 is coupled over line 21 to one side of resistor 36 and the output of amplifier 37. The other side of capacitor 34 is coupled over line 38 to the other side of resistor 36, one side of resistor 39 and a first input of amplifier 37. The other side of resistor 31 is coupled over line 40 to one side of resistor 41 and to a second input of amplifier 37. The other side of resistors 35, 39 and 41 are coupled to ground potential. Amplifier 37 may be, for example, a differential amplifier having an additional terminal coupled to voltage supply $V_1$ and a terminal coupled to ground. In one embodiment, capacitors 33 and 34 may have the same value of capacitance.

Loop filter 20b in FIG. 4 has input line 46 coupled to one end of resistors 47 and 48. The other side of resistor 47 is coupled over line 49 to one side of inductor 50. The other side of inductor 50 is coupled over line 51 to one side of capacitor 52 and to a first input of summing network 53. The other side of resistor 48 is coupled over line 55 to one side of capacitor 56. The other side of capacitor 56 is coupled over line 57 to one side of inductor 58 and to an input of attenuator 59.

Attenuator 59 functions to attenuate the signal on line 57 according to the relationship, for example, 20 LOG $\Omega_2^2/b_1$ dB and may be, for example, comprised of resistors. The output of attenuator 59 is coupled over line 60 to a second input of summing network 53. Input line 62 is coupled to the other side of capacitor 52, the other side of inductor 58, attenuator 59, summing network 53 and to ground potential. Summing network 53 which may be comprised of resistors or of resistors and an operational amplifier and has an output over lines 63 and 64. Summing network 53 functions to mathematically sum the voltage or current on lines 51 and 60 to provide an output signal indicative of the sum. In one embodiment loop filter 20 is passive, such as shown in FIG. 4 which may use only resistors, capacitors and inductors. In one embodiment resistors 47 and 48, inductors 50 and 58 and capacitors 52 and 56 may have the same value of resistance, inductance and capacitance, respectively.

Figure 5:
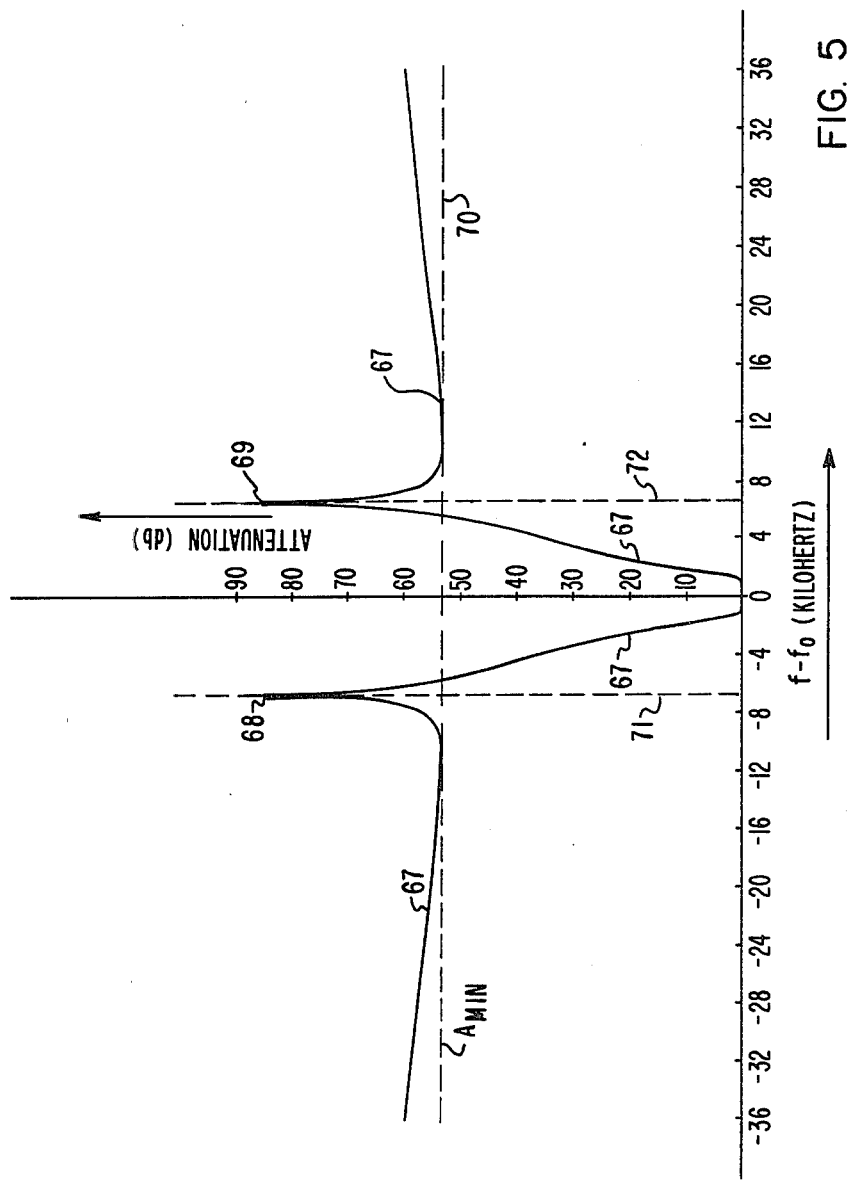
FIG. 5 is a graph of the two-sided bandpass attenuation of the embodiment of FIG. 1 where $n=3$.

FIG. 5 is the two-sided (bandpass) attenuation response of the n=3 embodiment of FIG. 1. In FIG. 5 the ordinate represents attenuation in decibels and the abscissa represents $f-f_0$ in kilohertz. The center frequency $f_0$ can be tuned over a specified frequency range by the action of the input signal and the transfer function of the phase-locked loop. At each of these tuned frequencies the response is shown by curve 67 in FIG. 5. The attenuation is theoretically infinite at points 68 and 69 on curve 67 at the frequencies corresponding to the low pass transmission zero on the j$\omega$ axis ($\Omega_2$) in the s plane shown by reference lines 71 and 72. The attenuation peak of curve 43 at reference line 42 in FIG. 2 corresponds to the attenuation peaks on curve 67, points 68 and 69 at reference lines 71 and 72 in FIG. 5. The attenuation falls to a minimum attenuation ($A_{min}$) shown by reference line 70 and then monotonically increases as the frequency $f-f_0$ increases.

Figure 6:
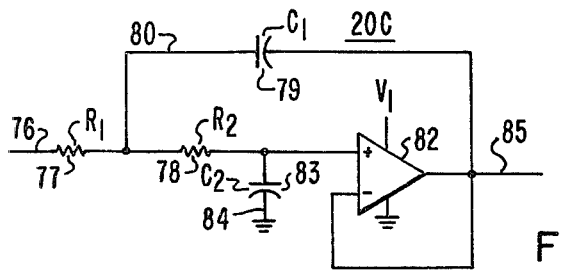
FIG. 6 is an active circuit schematic of an all-pole loop filter for use in the $n=3$ embodiment of FIG. 1.

An example of a second-order all-pole filter is shown by loop filter 20c in FIG. 6. Loop filter 20c has input line 76 coupled from input terminal 75 through resistor 77 to one side of resistor 78 and one side of capacitor 79 over line 80. The other side of resistor 78 is coupled over line 81 to a first input of amplifier 82 and to one side of capacitor 83. The other side of capacitor 83 is coupled over line 84 to ground potential. The other side of capacitor 79 is coupled over line 85 to a second input of amplifier 82, to an output of amplifier 82 and to an output terminal 86 of loop filter 20c. Amplifier 82 may be, for example, a differential amplifier having an additional terminal coupled to voltage supply $V_1$ and a terminal coupled to ground.

The general equation for a second-order all-pole loop filter is shown by equation (23) by letting n=3 in equation (19).

$$H_L(s) = b_1(s^2 + b_2 s + b_1) \quad (23)$$

The transfer function of loop filter 20c is shown by equation (24).

$$H_L(s) = \frac{\frac{1}{C_1 C_2 R_1 R_2}}{s^2 + \frac{1}{C_1}\left(\frac{1}{R_1} + \frac{1}{R_2}\right)s + \frac{1}{C_1 C_2 R_1 R_2}} \quad (24)$$

The invention herein allows a phase-locked loop 12 having a closed-loop response to duplicate a tabulated or well-known low-pass filter response with or without stop-band attenuation peaks by specifying the transfer function of the loop filter 20. Consequently, high-order loops with increased attenuation near the cutoff frequency are now realizable and tunable since a phase-locked loop is used which follows the input signal. By resorting to the stock pile of tabulated analog filter data to determine the closed-loop characteristics of the phase-locked loop, the approximation problem is reduced to a search of available curves and tables thereby eliminating the great computational effort usually associated with fabricating a phase-locked loop.

It is noteworthy that the closed-loop transmission zeros are retained by the loop filter 20, providing additional attenuation to unwanted frequencies at the phase detector output. The resulting phase-locked loop 12 is inherently stable because stable transfer functions were selected for the closed-loop responses. Obtained phase margins fall in acceptable range of 45° to 65°. Furthermore, it has been shown that loop filter 20 is unique to within a multiplicative constant for a specified closed-loop response. Furthermore, loop filter 20 has been extracted from the phase-locked loop allowing the transfer function of loop filter 20 and the loop again to be expressed in terms of the desired closed-loop transfer function coefficients of the phase-locked loop.

The invention provides for the extraction of the loop filter 20 from the phase-locked loop 12 allowing the systematic synthesis of a phase-locked loop 12 whose closed-loop response contains finite transmission zeros on the $j\omega$ axis. The class of responses of phase-locked loop 12 includes the Cauer filters, and the maximally-flat delay filters with Chebyshev stop-band attenuation, among others.

The invention provides a narrow-band filter apparatus for tracking a selected frequency in an input signal and for providing peak attenuation at fixed frequency spacings from the selected frequency comprising a phase-locked loop including a linear phase detector, an amplifier, a loop filter, and a voltage-controlled oscillator coupled in series, with the output fed back to the input and having a means for coupling the input signal to the linear phase detector and means for outputting a signal from the voltage controlled oscillator, the phase-locked loop having a predetermined open-loop gain K, the loop filter having circuit components of selected values and interconnected to provide a predetermined transfer function $H_L(s)$ characterized by a numerator having a first polynomial in s of at most degree n−1 and being equal to zero for specific values of $j\omega$ when s is set equal to $j\omega$ where j is the square root of −1 and $\omega$ is the radian frequency, and being not equal to zero when $\omega$ equals zero and a denominator having a second polynomial in s of degree n−1 where n is an integer greater than 2.

What is claimed is:

1. A phase-locked loop for tracking a selected frequency in an input signal and for providing peak attenuation at fixed frequency spacings from said selected frequency comprising,
   a linear phase detector having a first and second input and an output,
   an amplifier,
   a loop filter,
   a voltage-controlled oscillator,
   said output of said linear phase detector coupled through said amplifier, loop filter and voltage-controlled oscillator to said first input of said linear phase detector to form a signal loop having an open loop gain K,
   means for coupling an input signal to said second input of said phase detector,
   means for coupling an output signal from said voltage-controlled oscillator,
   said loop filter having a predetermined transfer function $H_L(s)$,
   said loop filter including
   an input terminal coupled to one side of a first and second resistor, the other side of said first resistor coupled through a first inductor to one side of a first capacitor and to a first input of a summing network, the other side of said second resistor coupled through a second capacitor to one side of a second inductor and to a first input of an attenuator network, the output of said attenuator network coupled to a second input of said summing network, the output of said summing network coupled to an output terminal of said loop filter, the other side of said first capacitor, the other side of said second inductor, a terminal of said attenuator and a terminal of said summing network all coupled to a first potential.

2. The phase-locked loop of claim 1 wherein the resistances of the first and second resistors are equal.

3. The phase-locked loop of claim 1 wherein the inductances of the first and second inductors are equal.

4. The phase-locked loop of claim 1 wherein the capacitances of the first and second capacitors are equal.

5. The phase-locked loop of claim 2 wherein the inductances of the first and second inductors are equal and the capacitances of the first and second capacitors are equal.

6. A narrow-band filter apparatus for tracking a selected frequency in an input signal and for providing peak attenuation at fixed frequency spacings from said selected frequency comprising,
   a phase-locked loop including a linear phase detector having a first and second input, an amplifier, loop filter, and voltage controlled oscillator coupled in series, with the output of said voltage controlled oscillator fed back to the first input of said linear phase detector and coupled to an output terminal and having a means for coupling said input signal to said second input of said linear phase detector, said phase-locked loop having a predetermined open loop gain K;
   said loop filter having circuit components of selected values and interconnected to provide a predetermined transfer function $H_L(s)$ characterized by a numerator having a first polynomial in s of at most degree n−1 and being equal to zero for specific values of jω when s is set equal to jω where j is the square root of −1 and ω is the radian frequency and being not equal to zero when ω equals zero, and a denominator having a second polynomial in s of degree n−1 where n is an integer greater than 2, said loop filter including an input terminal coupled to one side of a first and second resistor, the other side of said first resistor coupled through a first inductor to one side of a first capacitor and to a first input of a summing network, the other side of said second resistor coupled through a second capacitor to one side of a second inductor and to a first input of an attenuator network, the output of said attenuator network coupled to a second input of said summing network, the output of said summing network coupled to an output terminal of said loop filter, the other side of said first capacitor, the other side of said second inductor, a ground terminal of said attenuator and a ground terminal of said summing network all coupled together.

7. The filter of claim 6 wherein the resistances of the first and second resistors are equal.

8. The filter of claim 6 wherein the inductances of the first and second inductors are equal.

9. The filter of claim 6 wherein the capacitances of the first and second capacitors are equal.

10. The filter of claim 7 wherein the inductances of the first and second inductors are equal and the capacitances of the first and second capacitors are equal.

* * * * *